United States Patent [19]

Abe

[11] Patent Number: 5,313,434
[45] Date of Patent: May 17, 1994

[54] SEMICONDUCTOR MEMORY DEVICE

[75] Inventor: Kazuhiko Abe, Tokyo, Japan

[73] Assignee: NEC Corporation, Tokyo, Japan

[21] Appl. No.: 896,860

[22] Filed: Jun. 12, 1992

[30] Foreign Application Priority Data

Jun. 27, 1991 [JP] Japan .................... 3-183110

[51] Int. Cl.$^5$ .............................................. G11C 8/00
[52] U.S. Cl. .................... 365/233.5; 365/190; 365/203
[58] Field of Search ............... 365/233.5, 190, 203

[56]  References Cited

U.S. PATENT DOCUMENTS

| 4,636,991 | 1/1987 | Flannagan et al. ............. 365/203 X |
| 4,712,197 | 12/1987 | Sood .................................. 365/190 |
| 5,047,984 | 9/1991 | Monden ........................... 365/233 X |

Primary Examiner—Eugene R. LaRoche
Assistant Examiner—D. Hyun Yoo
Attorney, Agent, or Firm—Sughrue, Mion, Zinn, Macpeak & Seas

[57] ABSTRACT

A semiconductor memory device having a plurality of memory cells disposed in the form of a matrix with column switch circuits and an address transition detecting circuit. The column switch circuits are each provided for each of said bit line pairs with their one end connected to a corresponding bit line pair and their other end connected to a data line pair for changing the potential difference between the lines of the data line pair according to the potential difference between the lines of the corresponding bit line pair. Each switch circuit is selectively activated according to a column address decoder signal and an output pulse signal of the address transition detecting circuit.

9 Claims, 11 Drawing Sheets

SEMICONDUCTOR MEMORY DEVICE

BACKGROUND OF THE INVENTION

1. Field of the Invention

The present invention relates to a semiconductor memory device and, in particular, to a semiconductor memory device comprising a plurality of memory cells disposed in the form of a matrix, a plurality of bit line pairs each provided for each column of the memory cells and connected in common to the memory cells of that column and a plurality of column switch circuits each provided for each pair of bit lines to be used for selecting a single bit line pair from among the plurality of bit line pairs.

2. Description of the Related Art

In a semiconductor memory device, for example, a static random access memory (SRAM) or a dynamic random access memory (DRAM), memory cells are disposed in the form of a matrix. In order to enter and emit data to and from a specific memory cell, it is necessary to specify that memory cell by using a coordinate value defined by the row and column. To this end, each memory cell is connected to one of a plurality of word lines, which extend in the direction of the line, and one of a plurality of pairs of bit lines, which extend in the direction of the column. Since the pair of bit lines is used not only for specifying the memory cell, but also for transferring data to be entered and emitted, a sense amplifier and precharger circuit is connected to it. Since a single sense amplifier is generally provided corresponding to the plurality of bit line pairs, it is necessary to select a pair of bit lines connected to the sense amplifier from among these plural pairs of bit lines and, to this end, a column switch is provided for each pair of bit lines.

FIG. 1 is a block wiring diagram of a semiconductor memory device using three NMOS transistors for each column switch circuit. In this semiconductor memory device, addresses $A_0$ to $A_n$ are entered, and it is arranged so that, in order to access a specific one of the memory cells disposed in the form of the matrix, a specific row is selected by less significant address bits, and a specific column is selected by more significant address bits. Although, in this figure, for the convenience of description, four memory cells $51_1$ through $51_4$ are shown disposed along $2 \times 2$ rows/columns, the following description subsists also for semiconductor memory devices of large capacity such as 1 Mbits.

In this semiconductor memory device, there is provided row address decoder circuit 57 to which the less significant address bits are entered, column address decoder circuit 58 to which the more significant address bits are entered and address transition detecting circuit 56 for detecting the transition of the address value. From line address decoder circuit 57, two word lines $W_0$ and $W_1$ corresponding to the number of rows are outputted and, from column address decoder circuit 58, two column switch selecting signals $S_0$ and $S_1$ corresponding to the number of columns are outputted. Four memory cells $51_1$ to $51_4$ disposed in $2 \times 2$ are each connected to one of two word lines $W_0$ and $W_1$ and to one of the two pairs of bit lines $BL_0/\overline{BL_0}$ and $BL_1/\overline{BL_1}$. Precharger circuits $52_1$ and $52_2$ are each connected to one end portion of bit line pairs $BL_0/\overline{BL_0}$ and $BL_1/\overline{BL_1}$. Column switch circuits $53_1$ and $53_2$ are each connected to the other end of each bit line pair $BL_0/\overline{BL_0}$ and $BL_1/\overline{BL_1}$. These column switches $53_1$ and $53_2$ are intended to connect one of two bit line pairs $BL_0/\overline{BL_0}$ and $BL_1/\overline{BL_1}$ to the data line pair $DL/\overline{DL}$. These switch circuits $53_1$ and $53_2$ are controlled by column switch selecting signals $S_0$ and $S_1$, respectively. One end of data line pair $DL/\overline{DL}$ is connected to both column switch circuits $53_1$ and $53_2$ in common, and the other end is connected to sense amplifier circuit 55 via precharger circuit 54. Sense amplifier 55 outputs a binary signal to data bus DB depending on which of two data lines DL and $\overline{DL}$, which constitute data line pair $DL/\overline{DL}$, is higher in potential. Data latch/output buffer circuit 59 having data output terminal $D_{out}$ for emitting data to the outside is provided at the output side of sense amplifier circuit 55.

Here, while the bit line pair, word line and column switch selecting signal are generally denoted, their subscript is omitted and represented by $BL/\overline{BL}$ and W and S, respectively. Bit line pair $BL/\overline{BL}$ comprises bit lines BL and $\overline{BL}$. As can readily be understood by those skilled in the art, when the data is entered or emitted, the potential difference between two bit lines BL and $\overline{BL}$, which constitute a bit line pair $BL/\overline{BL}$, is changed according to the content of that data.

Column switch circuits $53_1$ and $53_2$ are each comprised of three NMOS field effect transistors $M_1$ through $M_3$. One bit line BL of bit line pair $BL/\overline{BL}$ is connected to the gate of first transistor $M_1$, and the drain of this transistor $M_1$ is connected to one data line DL of the data line pair $DL/\overline{DL}$. On the other hand, the other bit line $\overline{BL}$ is connected to the gate of second transistor $M_2$, and the drain of this transistor $M_2$ is connected to the other data line $\overline{DL}$. The sources of these two transistors $M_1$ and $M_2$ are connected in common and grounded via a channel of third transistor $M_3$. Entered to the gate of this third transistor $M_3$ is column switch selecting signal S from column address decoder circuit 58. As will be apparent to those skilled in the art, when third transistor $M_3$ is turned ON, first and second transistors $M_1$ and $M_2$ each function as a common source amplifier to form a differential amplifier by these two transistors $M_1$ and $M_2$.

As shown in FIG. 2, precharger circuits $52_1$, $52_2$ and 54 are each comprised of three MOS field effect transistors (MOS FET) $M_{91}$ to $M_{93}$, to the gate of which precharger circuit activating pulse signal P is supplied from address transition detecting circuit 56. When this pulse signal P is low, each of bit line pairs $BL_0/\overline{BL_0}$, $BL_1/\overline{BL_1}$ or data line pair $DL/\overline{DL}$ is precharged to a predetermined voltage value.

Next, the operation of this semiconductor memory device is described. If address signals $A_0$ to $A_n$ are changed, their change is detected by address transition detecting circuit 56, which, as shown in FIG. 3, outputs word line activating pulse signal XE, sense amplifier activating pulse signal SE and precharge circuit activating pulse signal P according to a predetermined timing. In other words, after the address value is changed, first, word line activating pulse signal XE is outputted (time $t_1$) and, a little later (time $t_2$), sense amplifier circuit activating pulse signal SE and precharge circuit activating pulse signal P are outputted. After word line activating pulse signal XE drops, at time $t_3$, the rest of pulse signals SE and P also drop, and all of pulse signals XE, SE and P are returned to their original state.

Column address decoder circuit 58 directly reflects the state of the more significant address bit on column switch selecting signal S. If the more significant bit takes a value indicating a specific column, then selecting signal S corresponding to that column is always high, and selecting signal S corresponding to the other column is low.

If the address is changed and word line activating pulse signal XE is emitted, then row address decoder circuit 57 decodes the less significant bit of address signals $A_0$ through $A_n$. Word line W corresponding to the decoded value retains the low state when pulse signal XE is low, and shifts to the high state when pulse signal XE is high. It is obvious that word line W not corresponding to the decoded value remains low. Actually, because of the presence of some time delay, the change of pulse signal XE precedes that of word line W. Here, if the difference between times $t_1$ and $t_2$ is preset to equal this delay time, then, if word line W is high, precharger circuit activating pulse signal P is turned high while, if word line W is low, then pulse signal P is also turned low. Since bit lines BL, $\overline{BL}$ and data lines DL, $\overline{DL}$ are precharged when pulse signal P is low, they are precharged before word line W is turned high, and no electric charge is supplied to them when word line W is high.

If, in this manner, word line W is turned high and is not precharged, a memory cell corresponding to high word line W is selected, and the data of the selected memory is emitted to bit line pair BL/$\overline{BL}$. In this case, the potential of one of bit lines BL, $\overline{BL}$ is reduced depending on the data stored within the memory cell. Then, when word line W is changed from the high to the low state, precharging is initiated again, and the bit line whose potential has been lowered is also returned to its original potential.

On the other hand, if column switch selecting signal S becomes high by the operation of column address decoder circuit 58, then third transistor $M_3$ is turned ON at the column switch circuit corresponding to selecting signal S. In this state, since first and second transistors $M_1$ and $M_2$ cooperatively function as a single differential amplifier, the difference between the drain potentials of first and second transistors $M_1$ and $M_2$ will end up in an amplification of the difference between the gate potentials, that is, the potential difference between bit lines BL, $\overline{BL}$. In consequence, the amplified signal of selected bit line pair BL/$\overline{BL}$ is transmitted to data line pair DL/$\overline{DL}$. Since selected signal S is established before word line W is turned high, the above-described amplified potential change of bit line pair BL/$\overline{BL}$, which was selected by selection signal S, is transmitted to data line pair DL/$\overline{DL}$. This change of data line pair DL/$\overline{DL}$ is amplified by sense amplifier circuit 55, and is emitted to the outside via latch/output buffer circuit 59 and output terminal $D_{out}$. The output of sense amplifier circuit 55 is indicated by DB.

If selection signal S is low, then, irrespective of the signal state of bit line pair BL/$\overline{BL}$, third transistor $M_3$ is cut off without exerting any effect on data line pair DL/$\overline{DL}$. Therefore, the data output to the outside does not depend on the state of the non-selected bit line pair BL/$\overline{BL}$.

Incidentally, one of the plurality of selection signals S, which is emitted from column address decoder circuit 58, never fails to turn high, and one of the column switch circuits is selected. This selected column switch circuit, any of three transistors $M_1$ to $M_3$, is turned ON. Therefore, when the word line is low, that is, precharged, current from precharger circuit 54 of data line pair DL/$\overline{DL}$ via data lines DL, $\overline{DL}$ to transistors $M_1$ to $M_3$ exists. This current is absorbed into a grounding point connected to transistor $M_3$.

In this semiconductor memory device, since the column switch is comprised of three NMOS transistors $M_1$ to $M_3$ only, the area occupied by the column switch circuit is small, and no layout problem of the device can take place. In other words, it is also possible to dispose the column switch circuit with the same width as that of the memory cell. However, if, as described above, precharging is carried out, since the current always begins to flow from precharge circuit 54 at the side of data line pair DL/$\overline{DL}$, current consumption can be increased. As the cycle time is increased, the precharging time occupies a greater ratio. Therefore, the longer the cycle time is, the current flowing from its precharger circuit cannot be neglected. If the bit arrangement which serves as the unit for inputting and outputting the data (the so-called data width) is large, since a plurality of column switch circuits corresponding to that bit arrangement is simultaneously selected, power consumption is further increased.

Therefore, in order to reduce power consumption, it is also conceivable to use a transfer gate for the column switch circuit. FIG. 4 is a block wiring diagram illustrating the arrangement of a semiconductor device which constitutes the column switch circuit with the transfer gate.

This semiconductor memory device, as in the one shown in FIG. 1, comprises four memory cells $71_1$ through $71_4$ arranged in 2×2, precharger circuits $72_1$, $72_2$, 74, sense amplifier circuit 75, address transition detecting circuit 76, row address decoder circuit 77, column address decoder circuit 78 and data latch/output buffer circuit 79. It is only different from the one shown in FIG. 1 in the arrangement of column switches $73_1$ and $73_2$ each connected to two pairs of bit lines $BL_0$/$\overline{BL_0}$ and $BL_1$/$\overline{BL_1}$.

Each of column switches $73_1$ and $73_2$ is a known transfer gate comprising two NMOS field effect transistors $M_5$, $M_8$, two PMOS field effect transistors $M_6$, $M_7$ and inverter $M_9$. Column switch selecting signal S is entered to the gate of NMOS transistors $M_5$ and $M_8$, and selecting signal S inverted by inverter $M_9$ is entered to the gate of PMOS transistors $M_6$ and $M_7$. The channels of transistors $M_5$ and $M_6$ are each connected in parallel. To one end of this parallel connection, bit line BL is connected and, to its other end, data line DL is connected. Likewise, the channels of transistors $M_7$ and $M_8$ are connected in parallel. At one end of this parallel connection, bit line $\overline{BL}$ is connected and, at its other end, data line $\overline{DL}$ is connected. As is apparent from the foregoing description, if column switch selecting signal S is high, then bit line pair BL/$\overline{BL}$ and data line pair DL/$\overline{DL}$ are electrically connected and, if selection signal S is low, then BL/$\overline{BL}$ and DL/$\overline{DL}$ are electrically cut off.

Next, the operation of this semiconductor memory device is described with reference to the timing chart of FIG. 5. Also in this case, if word line W is turned high, the data of the corresponding memory cell is emitted to bit line pair BL/$\overline{BL}$. As in the foregoing description, the time when word line W is changed between the high and low states and the time when precharger circuit activating pulse signal P is changed between the high and low states coincide. If column switch selecting signal S is turned high by column address decoder circuit 78, then each of transistors $M_5$ to $M_8$ is turned ON in the column switch circuit corresponding to selecting signal S, and the state of bit line pair BL/$\overline{BL}$, which corresponds to that column switch circuit, is transmitted to data line pair DL/$\overline{DL}$ as is. Since selecting signal S is established before word line W is turned high, the above-described potential change of bit line pair BL/$\overline{BL}$, which was selected by selecting signal S, will be transmitted, in the end, to data line pair DL/$\overline{DL}$ as it is. This change of data line pair DL/$\overline{DL}$ is amplified by sense amplifier circuit 75, and is emitted to the outside via data latch/output buffer circuit 79 and output terminal $D_{out}$.

In this semiconductor memory device, one of the plural selecting signals S from column address decoder circuit 78 never fails to turn high, and the column switch circuit corresponding to high selecting signal S is turned ON. However, since the turned-on column switch circuit is precharged from not only bit line pair BL/$\overline{BL}$, but from also data line pair DL/$\overline{DL}$ except for the time when data is entered or emitted, practically no current passes through this column switch circuit. Therefore, power consumption can be made relatively small. However, since the transfer gate comprising NMOS field effect transistors $M_5$ and $M_8$ and PMOS field effect transistors $M_6$ and $M_7$ is used for the column switch circuit, it is necessary to allow for a sufficiently large separation width between transistors $M_5$ to $M_8$ in order to prevent the latch-up effect. Further, since the diffusion factor of boron, which is used as a P-type impurity, is greater than that of arsenic, which is used as an N-type impurity, the designed size of the PMOS transistor, the length of the channel or the separation interval between the diffusion layers tends to become greater than that of the NMOS transistor. In consequence, this semiconductor memory does not allow the column switch circuit to be made small in size, which causes a layout problem. In other words, it is extremely difficult to dispose the column switch with the same width as the disposing interval between the memory cells.

SUMMARY OF THE INVENTION

Accordingly, an object of the present invention is to provide a semiconductor memory device which allows the column switch circuit to be made small while allowing power consumption of the column switch to be restricted to a low level.

The above-described object may be achieved by a semiconductor memory device comprising a plurality of memory cells disposed in the form of a matrix, a data line pair, a plurality of bit line pairs each corresponding to a specific column, a plurality of column switch circuits each provided for each of said bit line pairs with their one end connected to a corresponding bit line pair and their other end connected to said data line pair for changing the potential difference between the lines of said data line pair according to the potential difference between the lines of said corresponding bit line pair, a plurality of precharger circuits for electrically charging said data line pair, and an address transition detecting circuit, each memory cell being connected to one of said bit line pairs, characterized in that said column switch circuit is selectively activated according to a column address decoder signal and an output pulse signal of said address transition detecting circuit.

Also, the above-described object may be achieved by a semiconductor memory device comprising a plurality of memory cells disposed in the form of a matrix, a data line pair, a plurality of bit line pairs each corresponding to a specific column, a plurality of column switch circuits each provided for each of said bit line pairs with their one end connected to a corresponding bit line pair and their other end connected to said data line pair for changing the potential difference between the lines of said data line pair according to the potential difference between the lines of said corresponding bit line pair when a selecting signal is entered, a plurality of precharger circuits for electrically charging said data line pair, an address transition detecting circuit for detecting the address change to sequentially generate control pulse signals, and a column address decoder circuit for generating said selecting signal in order to selectively control each of said column switch circuits, each memory cell being connected to one of said bit line pairs, characterized in that said column address decoder circuit outputs said selecting signal based on a decoding signal of the column address bit and a predetermined one of said control pulse signals.

Further, the above-described object may also be achieved by a semiconductor memory device comprising a plurality of memory cells disposed in the form of a matrix, a data line pair, a plurality of bit line pairs each corresponding to a specific column, a plurality of column switch circuits each provided for each of said bit line pairs with their one end connected to a corresponding bit line pair and their other end connected to said data line pair for changing the potential difference between the lines of said data line pair according to the potential difference between the lines of said corresponding bit line pair when a selecting signal is entered, a plurality of precharger circuits for electrically charging said data line pair, an address transition detecting circuit for detecting the address change to sequentially generate control pulse signals, and a column address decoder circuit for generating said selecting signal based on a decoding signal of the column address bit in order to selectively control each of said column switch circuits, each memory cell being connected to one of said bit line pairs, characterized in that said column switch circuit comprises first and second transistors provided between each line of said data line pair and a common node so that said transistors are gate-controlled by each line of said bit line pair and a third and fourth transistors connected in series between said common node and a discharging point, one of said third and fourth transistors being gate-controlled by said selecting signal, the other of said third and fourth transistors being gate-controlled by a predetermined one of said control pulse signals.

The above and other objects, features and advantages of the present invention will become apparent from the following description referring to the accompanying drawings which illustrate an example of a preferred embodiment of the present invention.

DETAILED DESCRIPTION OF THE PREFERRED EMBODIMENTS

Several preferred embodiments according to the present invention are described in greater detail with reference to FIGS. 6 to 11.

Figure 1:
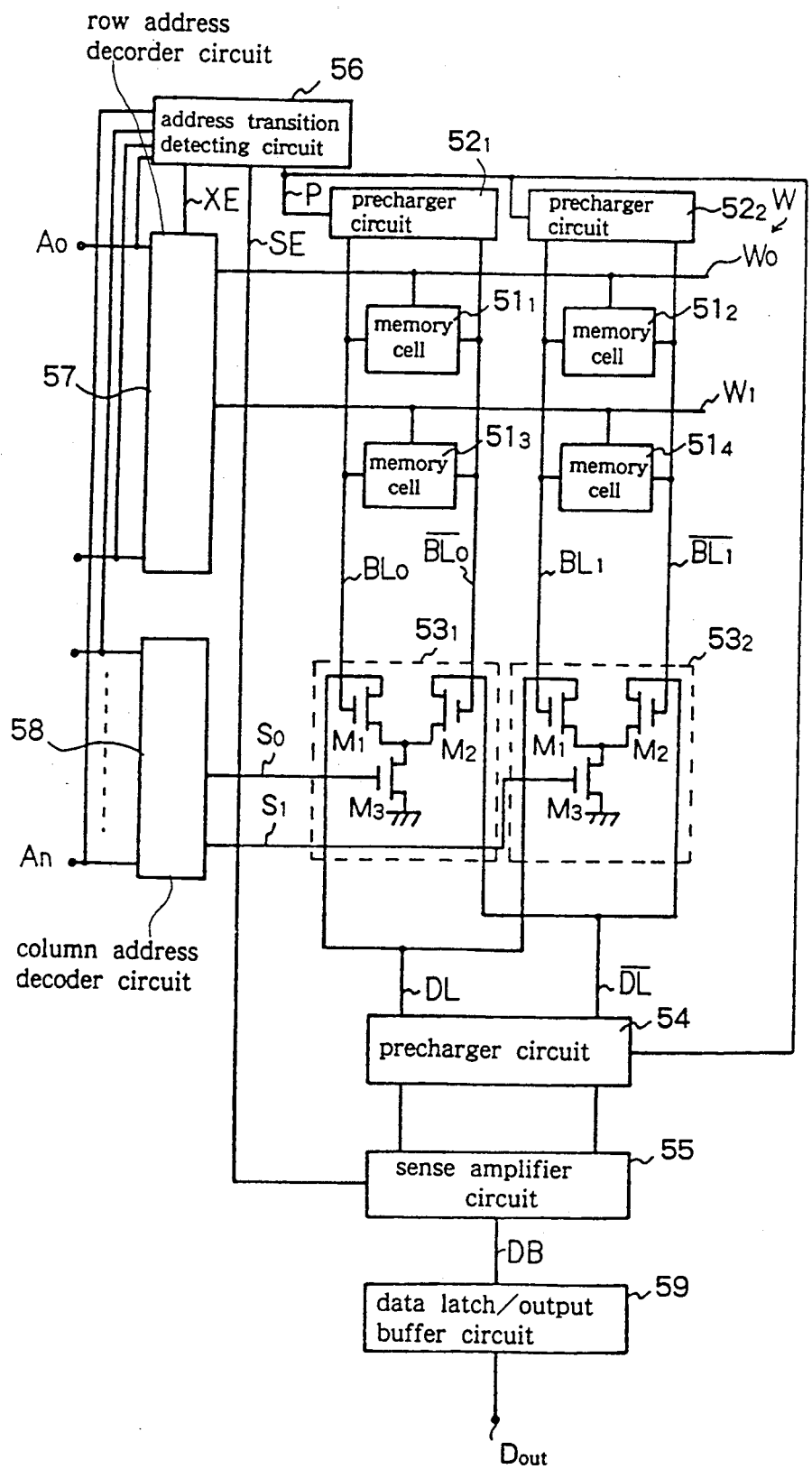
FIG. 1 is a block wiring diagram illustrating an example of the arrangement of a conventional semiconductor memory device.
Figure 2:
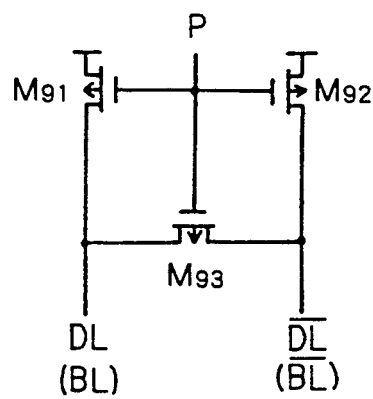
FIG. 2 is the block diagram illustrating the arrangement of a precharger circuit.
Figure 3:
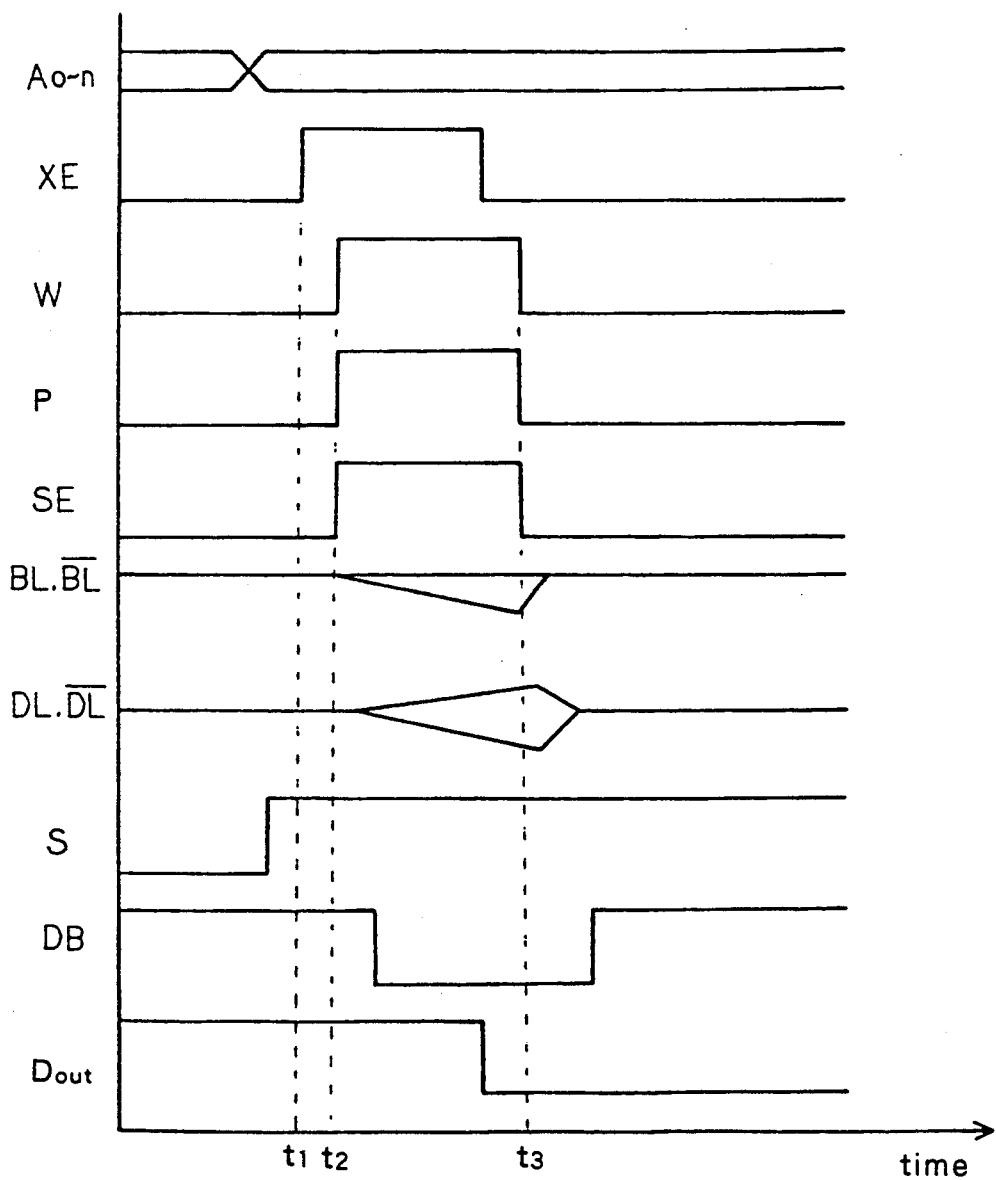
FIG. 3 is the timing chart of the semiconductor memory device shown in FIG. 1.
Figure 4:
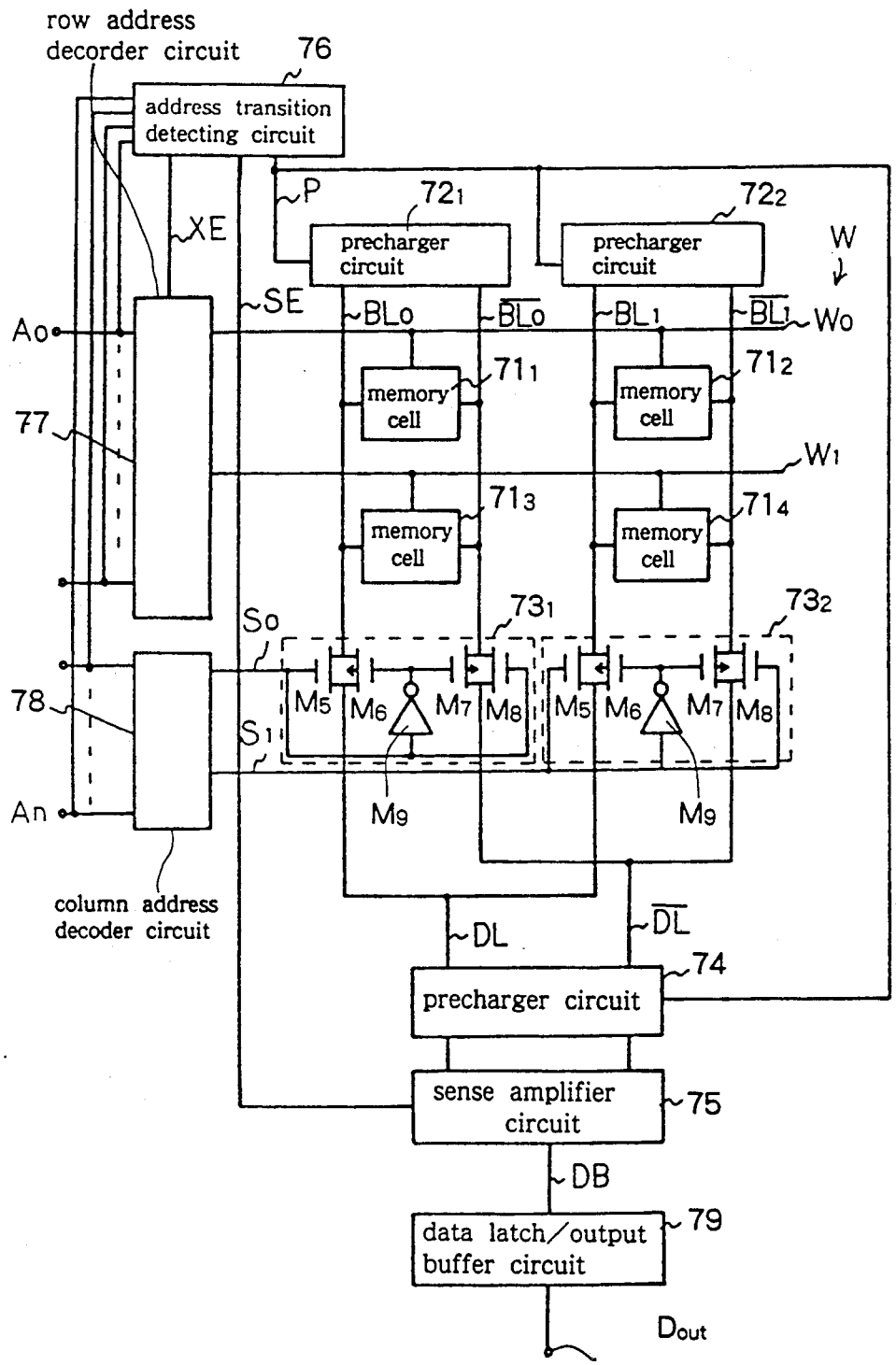
FIG. 4 is a block wiring diagram illustrating another example of a conventional semiconductor memory device.
Figure 5:
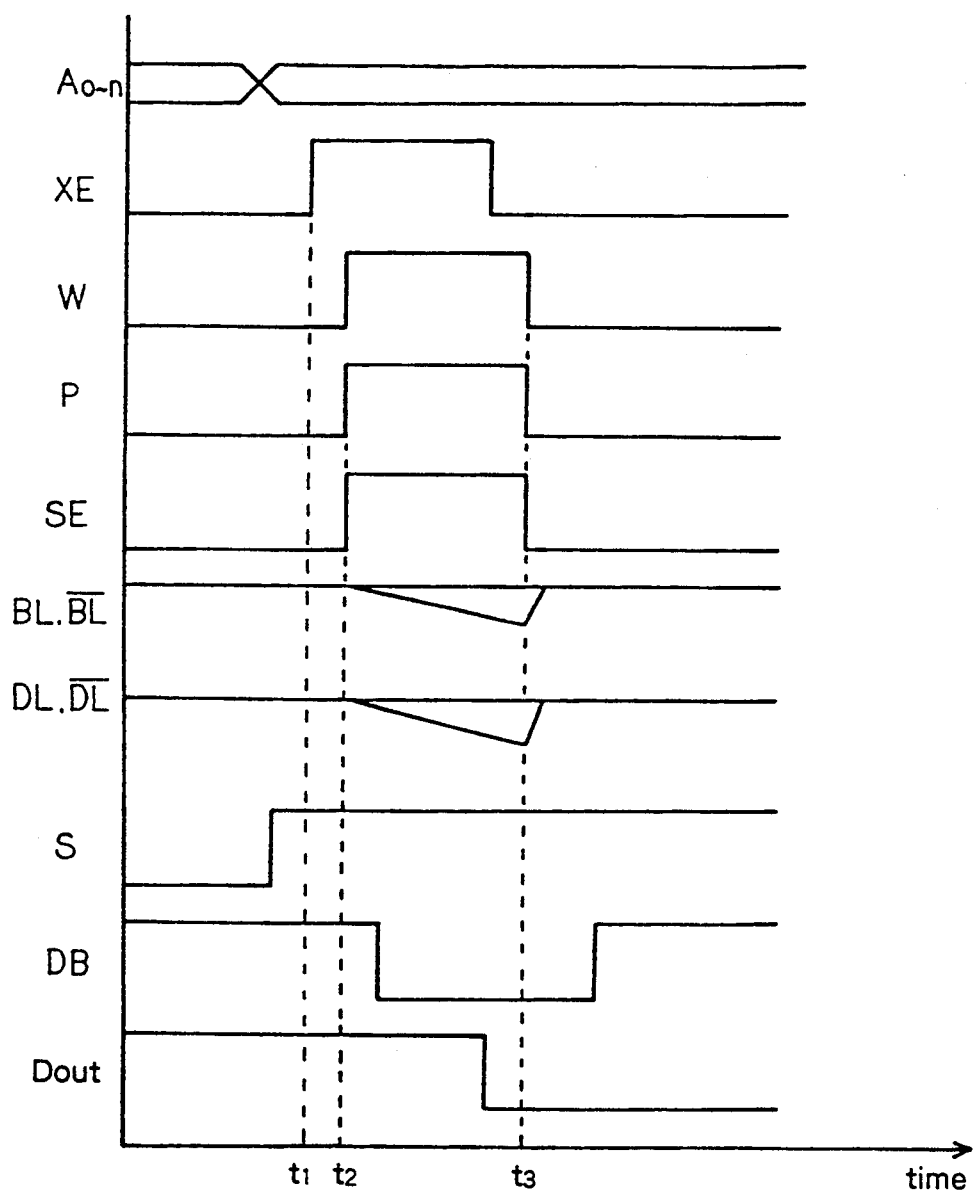
FIG. 5 is the timing chart of the semiconductor memory device shown in FIG. 4.
Figure 6:
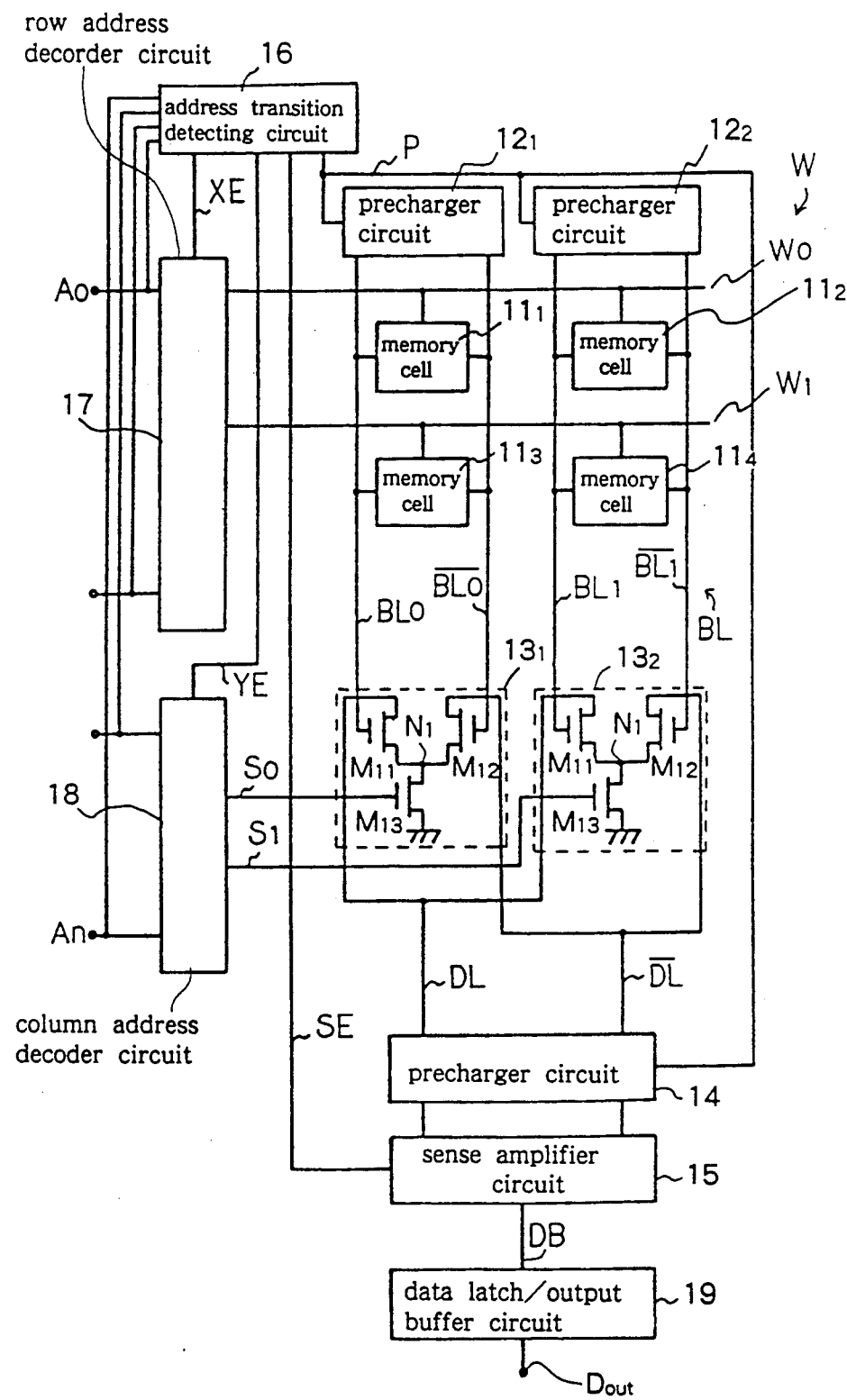
FIG. 6 is a block wiring diagram illustrating the arrangement of the semiconductor memory device according to the first embodiment of the present invention.

The semiconductor memory device according to the first embodiment of the present invention, which is shown in FIG. 6, is arranged similarly to the prior art one, which will be described with reference to FIG. 1. The former only differs from the latter in the provision of address transition detecting circuit 16 and column address decoder circuit 18. Memory cells $11_1$ to $11_4$, precharger circuits $12_1$, $12_2$ and 14, column switch circuits $13_1$ and $13_2$, sense amplifier circuit 15, row address decoder circuit 17 and data latch/output buffer circuit 19 are similar to those of the above-described semiconductor memory device. Although, in this figure, only four memory cells $11_1$ to $11_4$ are shown for the convenience of description, their number is not necessarily restricted to four, but the following description also applies to a case in which their number is $2^{20} (=1,048,576)$.

Figure 7:
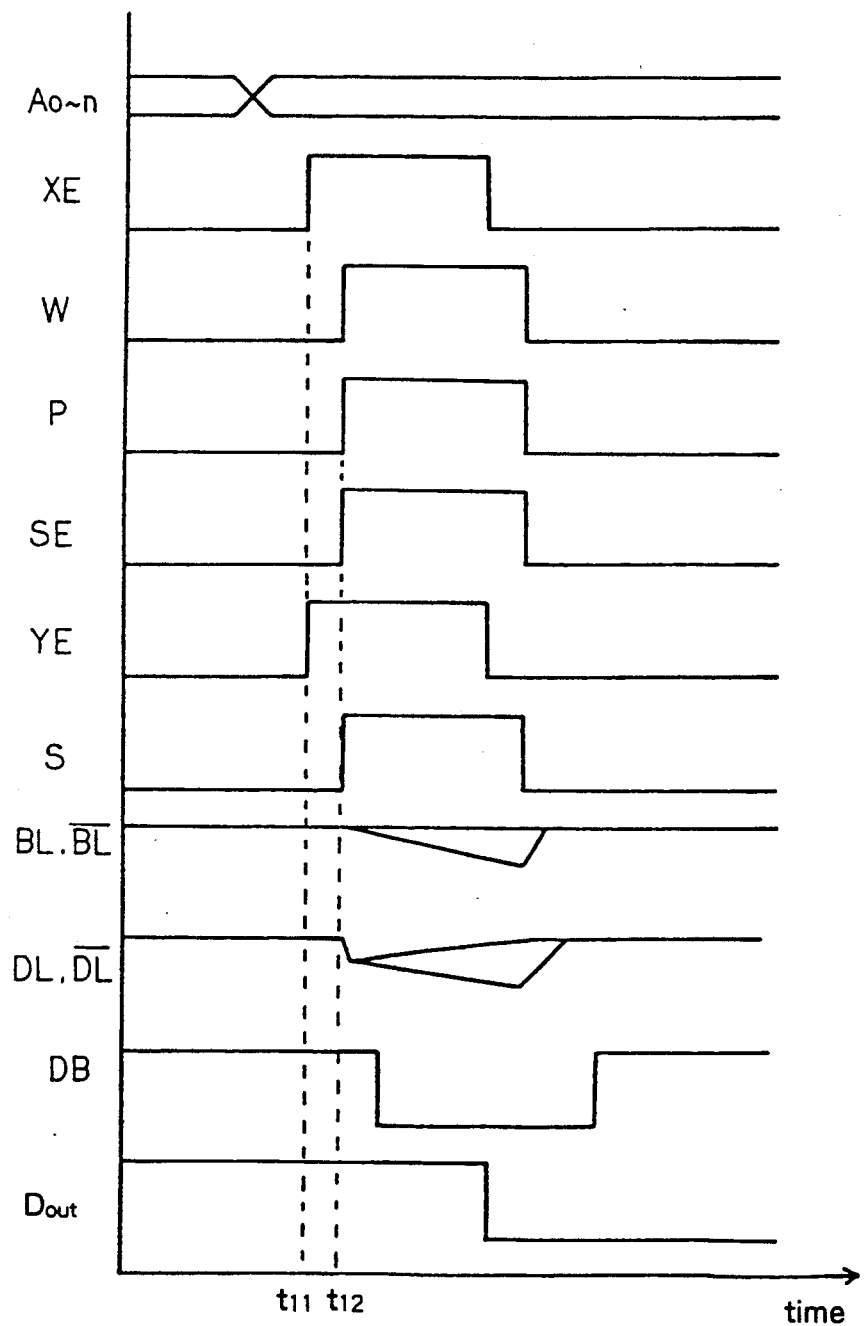
FIG. 7 is the timing chart of the semiconductor memory device shown in FIG. 6.

First, address transition detecting circuit 16 is described. It is intended to detect the change of address signals $A_0$ to $A_n$. When it senses a change in the address signal, address transition detecting circuit 16 outputs word line activating pulse signal XE, column switch circuit activating pulse signal YE, sense amplifier circuit activating pulse signal SE and precharger circuit activating pulse signal P, respectively, according to a predetermined timing as shown in FIG. 7. That is, address transition detecting circuit 16 raises word line activating pulse signal XE and column switch circuit activating pulse signal YE at time $t_{11}$ immediately after the address signal is changed, and raises sense amplifier circuit activating pulse signal SE and precharger circuit activating pulse signal P at following time $t_{12}$. After a predetermined period of time passes, address transition detecting circuit 16 first drops word line activating pulse signal XE and column switch circuit activating pulse signal YE and, subsequently, drops sense amplifier circuit activating pulse signal SE and precharger circuit activating pulse signal P.

Here, since word line activating pulse signal XE and column switch circuit activating pulse signal YE are outputted at the same timing, as address transition detecting circuit 16, for example, one may be used in which the capacity of the circuit for outputting word line activating pulse signal XE (for the address transition detecting circuit for the above-described conventional semiconductor memory device) is increased so that the output therefrom is branched into two, one for word line activating pulse signal XE, the other for column switch circuit activating pulse signal YE. Of course, as address transition detecting circuit 16 for this embodiment, one providing output circuits for each of word line activating pulse signal XE and column switch circuit activating pulse signal YE, may be used, in which case a time difference may be set between both pulse signals XE and YE, as necessary.

Figure 8:
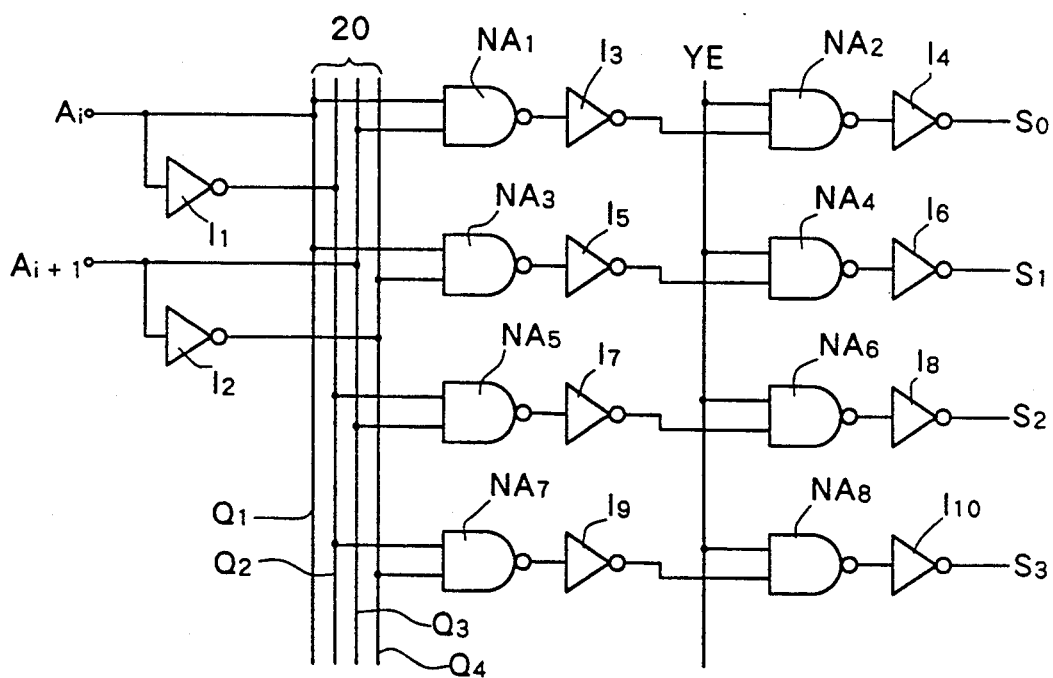
FIG. 8 is a circuit diagram illustrating the arrangement of a column address decoder circuit for the semiconductor memory device shown in FIG. 6.
Figure 9:
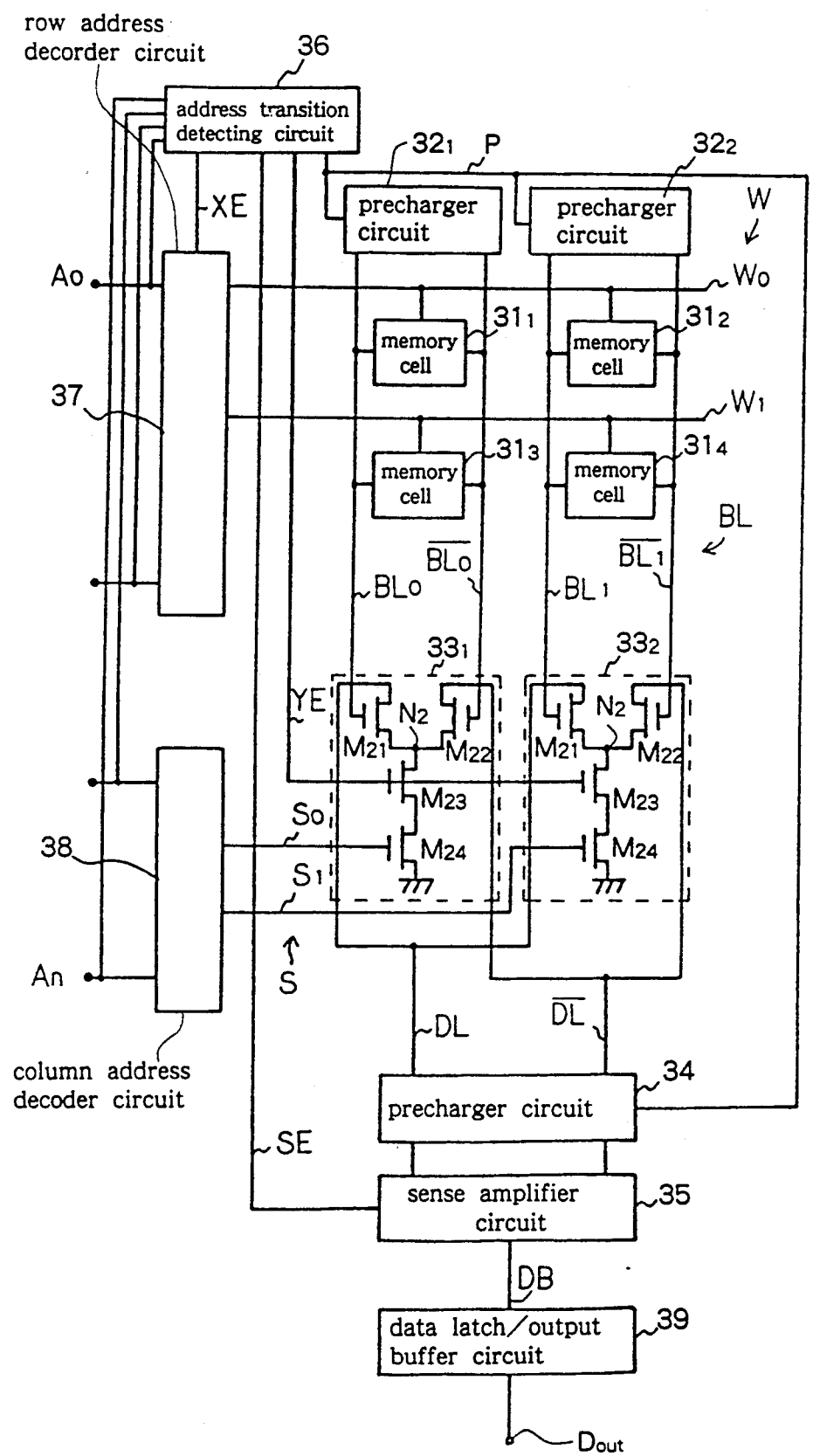
FIG. 9 is a block wiring diagram illustrating the arrangement of the semiconductor memory device according to the second embodiment of the present invention.

Next, column address decoder circuit 18 is described. Decoder circuit 18 receives the more significant address bits and column switch circuit activating pulse signal YE, and is intended to turn high one of a plurality of selecting signals S, which corresponds to the decoded result of the more significant address bits, only when pulse signal YE is high. Here, since four memory cells $11_1$ to $11_4$ are disposed in two columns, it is sufficient if only two column switch selecting signals $S_0$ and $S_1$, corresponding to a single address bit, are outputted from column address decoder circuit 18. Since the single bit decoder circuit is too simple, for the purpose of generalizing, let us assume that column address decoder circuit 18 outputs four selecting signals $S_0$ through $S_3$ with two address bit lines A1 and $A_{i+1}$ of the address signal line entered. As shown in FIG. 8, this column address decoder circuit 18 provides bus 20 comprising four signal lines $Q_1$ to $Q_4$, and has ten inverters $I_1$ to $I_{10}$ and eight NAND gates $NA_1$ to $NA_8$. Address bit line $A_i$ is connected to signal line $Q_1$ and the input of inverter $I_1$. The output of inverter $I_1$ is connected to signal line $Q_2$. The other address bit line $A_{i+1}$ is connected to signal line $Q_3$ and the input of inverter $I_2$, and the output of inverter $I_2$ is connected to signal line $Q_4$.

Corresponding to selecting signal $S_0$ are two NAND gates $NA_1$ and $NA_2$ and two inverters $I_3$ and $I_4$. Signal lines $Q_1$ and $Q_3$ are connected to the input of NAND gate $NA_1$, and the output of gate $NA_1$ is connected to the input of inverter $I_3$. The output of inverter $I_3$ and column switch circuit activating pulse signal YE are entered to NAND gate $NA_2$ and inverter $I_4$ is connected to the output of gate $NA_2$. The output of inverter $I_4$ is emitted to the outside of decoder circuit 18 as selecting signal $S_0$. As is apparent from the foregoing description, selecting signal $S_0$ is turned high only when any of pulse signal YE and signal lines $Q_1$ and $Q_3$ is high, but otherwise turns low. In other words, when address bit lines $A_i$ and $A_{i+1}$ are both high and pulse signal YE is high, selecting signal $S_0$ is turned high. Since, in practice, there is some time delay, selecting signal $S_0$ is turned high a little later than when pulse signal YE is turned high.

Similarly, gates $NA_3$ and $NA_4$ and inverters $I_5$ and $I_6$ correspond to selecting signal $S_1$. Selecting signal $S_1$ is turned high when address bit line $A_i$ is high, address bit line $A_{i+1}$ is low and pulse signal YE is high (actually, there is an effect caused by the time delay.). Further, gates $NA_5$ and $NA_6$ and inverters $I_7$ and $I_8$ correspond to selecting signal $S_2$, and gates $NA_7$ and $NA_8$ and inverters $I_9$ and $I_{10}$ correspond to selecting signal $S_3$. When address bit line $A_i$ is low, address bit line $A_{i+1}$ is high and pulse signal YE is high, selecting signal $S_2$ is turned high, and when address bit line $A_i$ is low, address bit line $A_{i+1}$ is low and pulse signal YE is high, selecting signal $S_3$ is turned high (actually, there is an effect caused by the time delay).

The signal timing of each portion of this semiconductor memory device is described in further detail with reference to the timing chart of FIG. 7.

If an address change is detected, as described above, address transition detecting circuit 16 causes word line activating pulse signal XE and column switch circuit activating pulse signal YE to turn high and, a little later, causes sense amplifier circuit activating pulse signal SE and precharger circuit activating pulse signal P to turn high. If word line activating pulse signal XE is turned high, row address decoder circuit 17 decodes the less significant bits of address signals $A_0$ to $A_n$. Word line W corresponding to the decoded value remains low when pulse signal XE is low, and shifts to the high state when pulse signal XE is high. Of course, word line W not corresponding to the decoded value remains low. Because of the effect caused by the time delay, when word line W is high, precharger circuit activating pulse signal P is turned high and, when word line W is low, pulse signal P is also turned low. Since each of bit lines BL, $\overline{BL}$ and data lines DL, $\overline{DL}$ are precharged when pulse signal P is low, they are precharged before word line W is turned high and, when word line W is high, no charge is supplied thereto.

If, as described above, word line W is turned high and no precharging is conducted, a memory cell corresponding to the turned-high word line W is selected, and the data of the selected memory cell is emitted to bit line pair BL/$\overline{BL}$. In this case, according to the data stored within the memory cell, the potential of one of bit lines BL/$\overline{BL}$ is reduced. Thereafter, when word line W is turned from high into low, precharging is started again, and the bit line whose potential has been lowered once is returned again to its original potential.

Incidentally, if column switch selecting signal S is turned high by column address decoder circuit 18, then third transistor $M_{13}$ is turned ON in the column switch circuit corresponding to selecting signal S. In this state, since first and second transistors $M_{11}$ and $M_{12}$ constitutes a differential amplifier circuit, the difference between their drain potentials ends up in an amplified difference between the gate potentials, i. e., an amplified potential difference between bit lines BL, $\overline{BL}$. Here, let us assume that the potential of common connecting point N1 for three transistors $M_{11}$ to $M_{13}$ is $V_{N1}$, that the potential of each bit line BL, $\overline{BL}$ is each $V_{BL}$, $V_{\overline{BL}}$ and that the potential of each data line DL, $\overline{DL}$ is each $V_{DL}$ and $V_{\overline{DL}}$. Then, if $V_{BL}-V_{N1}>V_{\overline{BL}}-V_{N1}$, then $V_{DL}<V_{\overline{DL}}$ and, if $V_{BL}-V_{N1}>V_{e,ovs/BL/}-V_{N1}$, then $V_{DL}>V_{\overline{DL}}$. Therefore, the amplified signal of selected bit line pair BL/$\overline{BL}$ is transmitted to data line pair DL/$\overline{DL}$. This change of data line pair DL/$\overline{DL}$ is amplified by sense amplifier circuit 15, and is emitted to the outside via data latch/output buffer circuit 19 and output terminal $D_{out}$.

In this semiconductor memory device, since selecting signal S from column address buffer circuit 18 is turned high at the time when word line W is turned high, the data content within the memory cell is normally transmitted to sense amplifier circuit 15. Further, when column switch circuit activating pulse signal YE is low, all selecting signals S are turned low. If all selecting signals S are low, then third transistor $M_{13}$ of all the column switch circuits is cut off, and the current from precharger circuit 14 does not flow out. Only when pulse signal YE is high, the current is consumed in the column switch circuit, and the current consumption can be greatly reduced as compared with the conventional semiconductor memory device shown in FIG. 1. In this case, since the width of pulse signal YE generally does not depend on the cycle time, even if the cycle time is increased, the mean current consumption is not increased. Additionally, in this semiconductor memory device, since the column switch circuit is constituted by only three NMOS transistors $M_{11}$ to $M_{13}$, the area occupied by the column switch circuit is not increased either.

Next, the semiconductor memory device according to a second embodiment of the present invention is hereinafter described. Although this type of semiconductor memory device is essentially similar to that of the above-described first embodiment, it differs from the latter in the arrangement of column switches $33_1$ and $33_2$ and column address decoder circuit 38 as well as the timing when column switch circuit activating pulse signal YE is outputted from address transition detecting circuit 36. Memory cells $31_1$ to $31_4$, precharger circuits $32_1$, $32_2$ and 34, sense amplifier circuit 35, row address decoder circuit 37 and data latch/output buffer circuit 39 are similar to those of the first embodiment.

Each of column switch circuits $33_1$ and $33_2$ is described. These column switch circuits are each comprised of four NMOS transistors $M_{21}$ to $M_{24}$. One bit line BL of bit line pair BL/$\overline{BL}$ is connected to the gate of first transistor $M_{21}$, and the drain of transistor $M_{21}$ is connected to one data line DL of data line pair DL/$\overline{DL}$. The other bit line $\overline{BL}$ is connected to the gate of second transistor $M_{22}$ and the drain of transistor $M_{22}$ is connected to the other data line $\overline{DL}$. The sources of two transistors $M_{21}$ and $M_{22}$ are connected in common. The intermediate portion between the grounding point and common connecting point $N_2$ is connected by third and fourth transistors $M_{23}$ and $M_{24}$. Third and fourth transistors $M_{23}$ and $M_{24}$ are connected in series, and third transistor $M_{23}$ is provided at the side of the grounding point. Column switch selecting signal S is emitted to the gate of third transistor $M_{23}$ from column address decoder circuit 38. Column switch circuit activating pulse signal YE is entered to the gate of fourth transistor $M_{24}$ from address transition detecting circuit 36. Pulse signal YE is entered in common to fourth transistor $M_{24}$ of the plural column switch circuits. As will readily be understood by those skilled in the art, third and fourth transistors $M_{23}$ and $M_{24}$ may be alternative.

Compared with the column switch circuit for the first embodiment, in this one, the fourth transistor is inserted between the common connecting point for the first and second transistors and the third transistor. In consequence, first and second transistors $M_{21}$ and $M_{22}$, when third and fourth transistors $M_{23}$ and $M_{24}$ are both turned ON, constitutes a differential amplifier.

Figure 10:
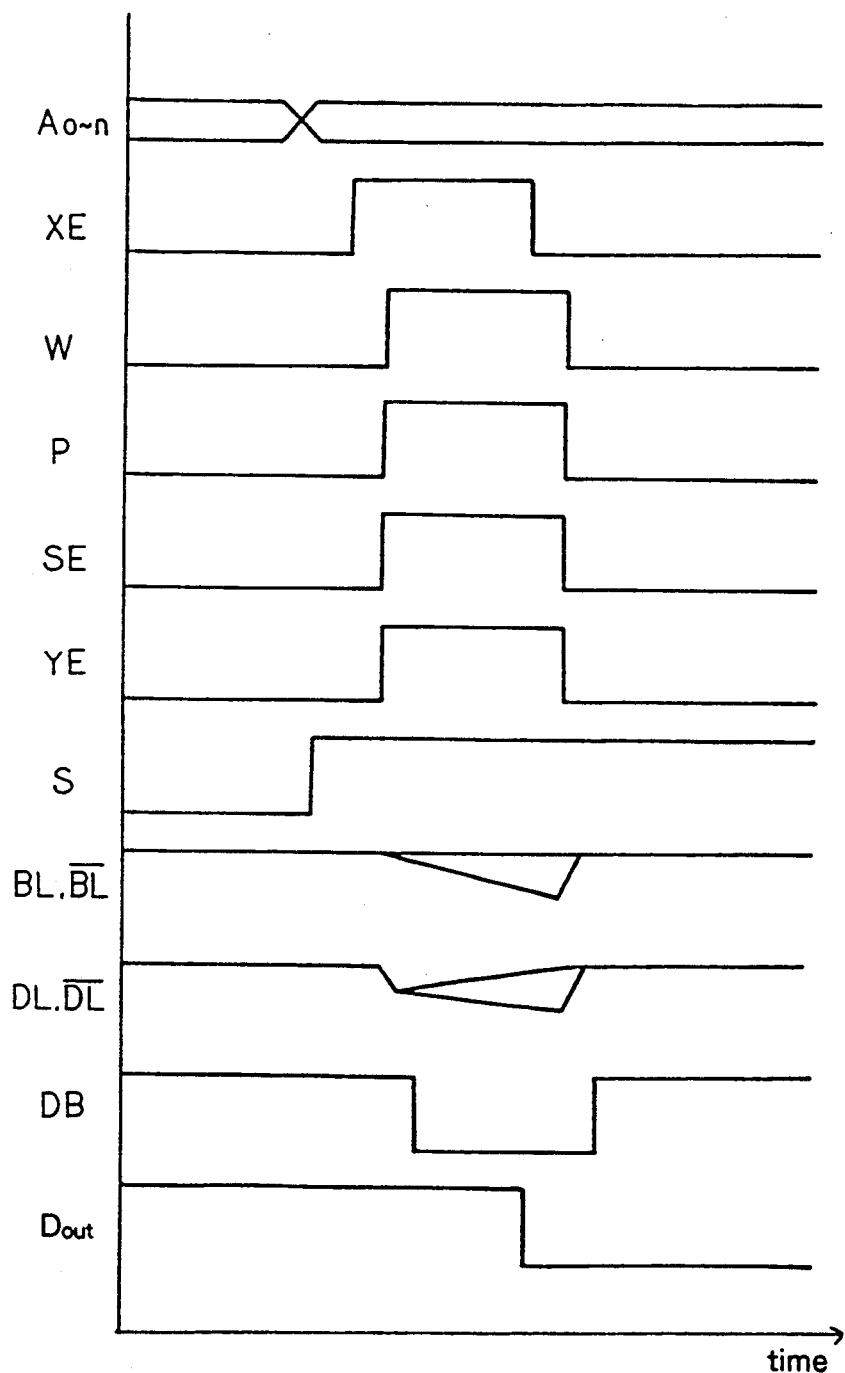
FIG. 10 is the timing chart of the semiconductor memory device shown in FIG. 9.

The timing each signal is emitted from address transition detecting circuit 36 is illustrated in the timing chart of FIG. 10. In address transition detecting circuit 36, later than word line activating pulse signal XE, column switch circuit activating pulse signal YE is outputted at substantially the same timing as sense amplifier circuit activating pulse signal SE and precharger circuit activating pulse signal P. As such an address transition detecting circuit 36, for example, one may be used in which the capacity of the circuit for emitting sense amplifier circuit activating pulse signal SE (for the above-described conventional address transition detecting circuit) is increased, and the output therefrom is branched, one for sense amplifier circuit activating pulse signal SE and the other for column switch circuit activating pulse signal YE.

Figure 11:
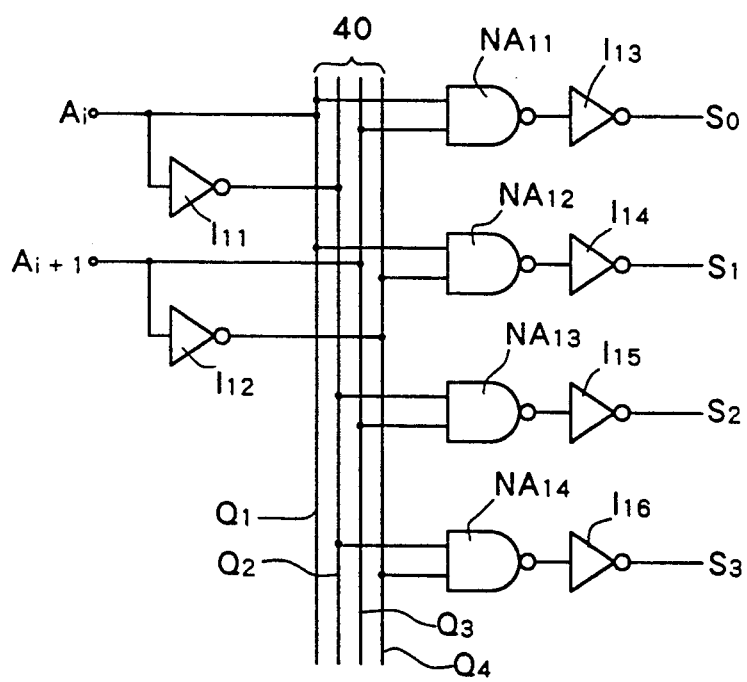
FIG. 11 is a circuit diagram illustrating the arrangement of a column address decoder circuit for the semiconductor memory device shown in FIG. 9.

As in the above-described conventional column address decoder circuit, column address decoder circuit 38 directly reflects the state of the more significant address bits on column switch selecting signal S. When the more significant bits take a value indicating a specific column, selecting signal S corresponding to that column is always turned high, and selecting signal S corresponding to the other column is turned low. FIG. 11 illustrates an example of arrangement of column address decoder circuit 38 for outputting four column switch circuit selecting signals $S_0$ to $S_3$. Decoder circuit 38 provides four signal lines $Q_1$ to $Q_4$ therein, and has six inverters $I_{11}$ to $I_{16}$ and four NAND gates $NA_{11}$ through $NA_{14}$. Address bit line $A_i$ is connected to signal line $Q_1$ and the input of inverter $I_{11}$. The output of this inverter $I_{11}$ is connected to signal line $Q_2$. Other address bit line $A_{i+1}$ is connected to signal line $Q_3$ and the input of inverter $I_{12}$, and the output of inverter $I_{12}$ is connected to signal line $Q_4$.

NAND gate $NA_{11}$ and inverter $I_{13}$ correspond to selecting signal $S_0$. Signal lines $Q_1$ and $Q_3$ are connected to the input of NAND gate $NA_{11}$, the output of which is connected to the input of inverter $I_{13}$. The output of inverter $I_{13}$ is emitted to the outside as selecting signal $S_0$. As is apparent from the preceding description, selecting signal $S_0$, when either signal line $Q_1$ or $Q_3$ is high, is turned high and, otherwise, turned low. In other words, when address bit lines $A_i$ and $A_{i+1}$ are both high, selecting signal $S_0$ is turned high. Similarly, selecting signals $S_1$ to $S_3$ are turned high or low depending on the value represented by address bit lines $A_i$ and $A_{i+1}$. In this case, only one selecting signal S is turned high at the same time.

Next, the signal timing of each portion for this semiconductor memory device is described in further detail with reference to the timing chart of FIG. 10.

When the address change is detected, as described above, word line activating pulse signal XE is turned high first, and a little later, sense amplifier circuit activating pulse signal SE, precharge circuit activating pulse signal P and column switch circuit activating pulse signal YE are each turned high. If word row activating pulse signal XE is turned high, as in the above-described embodiment, word line W corresponding to the value decoded by row address decoder circuit 37 is turned high, which makes precharging impossible. Then, the data stored within the memory cell corresponding to turned-high word line W is outputted to bit line pair BL/$\overline{BL}$. In this case, depending on the data stored within the memory cell, the potential of one of bit lines BL, $\overline{BL}$ is lowered. Thereafter, when word line W is changed from low into high, precharging is started again, and the bit line whose potential has been lowered once is also returned to its original potential.

Column switch selecting signal S corresponding to the entered address is always turned high by column address decoder circuit 38, and third transistor $M_{23}$ is turned ON at the column switch circuit corresponding to selecting signal S. However, since, in the column switch circuit, third and fourth transistors $M_{23}$ and $M_{24}$ are provided in series, as long as fourth transistor $M_{24}$ is not turned ON, they do not function as the differential amplifier circuit. Column switch activating pulse signal YE is supplied to the gate of each fourth transistor $M_{24}$, and fourth transistor $M_{24}$ is turned ON at the only timing when this pulse signal YE is high. It is when selecting signal S corresponding to that column switch circuit is high and pulse signal YE is high that third and fourth transistors $M_{23}$ and $M_{24}$ are simultaneously turned ON. When pulse signal YE is high, since selected word line W is also high, the data within the selected memory cell is normally transmitted to data line pair DL/$\overline{DL}$ via bit line pair BL/$\overline{BL}$. This change of data line pair DL/$\overline{DL}$ is amplified at sense amplifier circuit 35, and is emitted to the outside via data latch/output buffer circuit 39 and output terminal $D_{out}$.

In this semiconductor memory device, when considered as a whole, the third and fourth transistors of the column switch circuit are simultaneously turned ON as word line W is turned high at the selected column switch circuit. Therefore, no current flows out of the precharger circuit, so that, as in the first embodiment, the current consumption can be greatly reduced compared with the conventional one shown in FIG. 1. When those of the first and second embodiments are compared with each other, it can be seen that, although, in the former, the number of NMOS transistors is small for each column switch circuit, the arrangement of the column address decoder circuit becomes complicated.

It is to be understood that variations and modifications of a semiconductor memory device disclosed herein will be evident to those skilled in the art. It is intended that all such modifications and variations be included within the scope the appended claims.

What is claimed is:

1. A semiconductor memory device comprising a plurality of memory cells disposed in the form of a matrix, a data line pair, a plurality of bit lie pairs each corresponding to a specific column, a plurality of word lines each corresponding to a specific row, a plurality of column switch circuits each provided for each of said bit line pairs with their one end connected to a corresponding bit lien pair and their other end connected to said data line pair for changing the potential difference between the lines of said data line pair according to the potential difference between the lines of said corresponding bit line pair, a plurality of precharger circuits for electrically charging said data line pair, an address transition detecting circuit for generating an output pulse signal in response to any change in a column address signal or a row address signal, and a column address decoder circuit for generating a selecting signal to select one of said column switch circuits in accordance with said column address signal, each memory cell being connected to one of said bit line paris and to one of said word lines, one of said word lines being selected in accordance with said row address signal, said column switch circuit selected by said selecting signal being activated when said output pulse signal is in an active state, so that said selected column switch circuit is both activated for a predetermined period and is disabled after said predetermined period at least when said row address signal changes.

2. A semiconductor memory device comprising a plurality of memory cells disposed in the form of a matrix, a data line pair, a plurality of bit lien pairs each corresponding to a specific column, a plurality of word lines each corresponding to a specific row, a plurality of column switch circuits each provided for each of said bit line pairs with their one end connected to a corresponding bit line pair and their other end connected to said data line pair for changing the potential difference between the lines of said data line pair according to the potential difference between the lines of said corresponding bit line pair when a selecting signal is entered, a plurality of precharger circuit for electrically charging said data line pair, an address transition detecting circuit for detecting any change in a row address signal or a column address signal to sequentially generate control pulse signals, and a column address decoder circuit for generating said selecting signal in order to selectively control each of said column switch circuit in accordance with said column address signal, each memory cell being connected to one of said bit line pairs and to one of said word lines, one of said words lines being selected in accordance with said row address signal, said column address decoder circuit outputting said selecting signal in accordance with a decoding signal of a column address bit and a predetermined one of said control pulse signals, so that a selected said column switch circuit is both activated for a predetermined period and is disabled after said predetermined period if at least said row address signal changes.

3. A semiconductor memory device as set forth in claim 2, wherein said each column switch circuit includes a differential amplifier which uses said corresponding bit line pair as the input ad said data line pair as the output.

4. A semiconductor memory device as set forth in claim 2, wherein said each column switch circuit comprises first and second transistors provided between each line of said data line pair and a common node so that each transistor may be gate controlled by each line of said corresponding bit line pair and a third transistor provided between said common node and a discharging position so that said third transistor is gate-controlled by said selecting signal.

5. A semiconductor memory device as set forth in claim 4, wherein any of said first, second and third transistors is an N-channel MOS field effect transistor.

6. A semiconductor memory device comprising a plurality of memory cells disposed int he form of a matrix, a data line pair, a plurality of bit line pairs each corresponding to a specific column, a plurality of column switch circuits each provided for each of said bit line pairs with their one end connected to a corresponding bit lien pair and their other end connected to said data line pair for changing the potential difference between the lines of said data line pair according to the potential difference between the lines of said corresponding bit line pair when a selecting signal is entered, a plurality of precharger circuits for electrically charging said data line pair, an address transition detecting circuit for detecting an address change to sequentially generate control pulse signals, and a column address decoder circuit for generating said selecting signal in order to selectively control each of said column switch circuits, each memory cell being connected to one of said bit line pairs, said column address decoder circuit outputting said selecting signal in accordance with a decoding signal of a column address bit and a predetermined one of said control pulse signals, said each column switch circuit comprising first and second transistors provided between each line of said data line pair and a common node so that said first and second transistors may be gate-controlled by each line of said corresponding bit line pair, and a third transistor provided between said common node and a discharging point so that said third transistor is gate-controlled by said selecting signal, and said predetermined control pulse signal being output from said address transition detecting circuit prior to a pulse signal to interrupt the operation of said precharger circuits.

7. A semiconductor memory device comprising a plurality of memory cells disposed int he form of a matrix, a data line pair, a plurality of bit lien pairs each corresponding to a specific column, a plurality of column switch circuits each provided for each of said bit line pairs with their one end connected to a corresponding bit lien pair and their other end connected to said data line pair for changing the potential difference between the lines of said data line pair according to the potential difference between the lines of said corresponding bit line pair when a selecting signal is entered, a plurality of precharger circuits for electrically charging said data line pair, an address transition detecting circuit for detecting an address change to sequentially generate control pulse signals, and a column address decoder circuit for generating said selecting signal based on a decoding signal of a column address bit in order to selectively control each of said column switch circuits, each memory cell being connected to one of said bit line pairs, characterized in that said each column switch circuit comprises first and second transistors provided between each line of said data line pair and a common node so that said transistors are gate-controlled by each line of said corresponding bit lien pair and a third and fourth transistors connected in series between said common node and a discharging point, one of said third and fourth transistors being gate-controlled by said selecting signal, the other of said third and fourth transistors being gage-controlled by a predetermined one of said control pulse signals.

8. A semiconductor memory device as set forth in claim 7 wherein any of said first, second, third and fourth transistors is an N-channel MOS field effect transistor.

9. A semiconductor memory device as set forth in claim 8 wherein said predetermined control pulse signal is outputted from said address transition detecting circuit in substantial synchronism with a control pulse signal to interrupt the operation of said precharger circuit emitted.

* * * * *

UNITED STATES PATENT AND TRADEMARK OFFICE
CERTIFICATE OF CORRECTION

PATENT NO. : 5,313,434

DATED : May 17, 1994

INVENTOR(S) : Kazuhiko Abe

It is certified that error appears in the above-identified patent and that said Letters Patent is hereby corrected as shown below:

Col. 8, line 37, delete "$I_2$is" insert --$I_2$ is--.

Col. 9, line 51, delete "> $V_{e,ovs/BL/}$" insert --< $V_{\overline{BL}}$--.

Col. 11, line 64, delete "$M_{24}$is" insert --$M_{24}$ is--.

Col. 12, line 38, delete "lien" insert --line--;

Col. 12, line 61, delete "lien" insert --line--.

Col. 13, line 24, delete "ad" insert --and--;

Col. 13, line 33, delete "position", insert --point--;

Col. 13, line 39, delete "int he" insert --in the--;

Col. 13, line 44, delete "lien" insert --line--.

Col. 14, line 16, delete "int he" insert --in the--;

Col. 14, line 17, delete "lien" insert --line--;

Col. 14, line 21, delete "lien" insert --line--;

Col. 14, line 39, delete "lien" insert --line--;

UNITED STATES PATENT AND TRADEMARK OFFICE
CERTIFICATE OF CORRECTION

PATENT NO. : 5,313,434
DATED : May 17, 1994
INVENTOR(S) : Kazuhiko Abe

It is certified that error appears in the above-indentified patent and that said Letters Patent is hereby corrected as shown below:

Col. 14, line 55, delete "circuit" insert --circuits--.

Signed and Sealed this

Eighteenth Day of October, 1994

Attest:

BRUCE LEHMAN

Attesting Officer   Commissioner of Patents and Trademarks